United States Patent [19]

Chin et al.

[11] Patent Number: 4,980,304

[45] Date of Patent: Dec. 25, 1990

[54] PROCESS FOR FABRICATING A BIPOLAR TRANSISTOR WITH A SELF-ALIGNED CONTACT

[75] Inventors: Gen M. Chin; Tzu-Yin Chiu, both of Marlboro; Te-Yin M. Liu, Red Bank; Alexander M. Voshchenkov, Freehold, all of N.J.

[73] Assignee: AT&T Bell Laboratories, Murray Hill, N.J.

[21] Appl. No.: 482,437

[22] Filed: Feb. 20, 1990

[51] Int. Cl.$^5$ .................... H01L 21/00; H01L 21/02; H01L 21/285; H01L 29/72

[52] U.S. Cl. ........................................ 437/31; 437/41; 437/43; 357/33; 357/34; 148/DIG. 11

[58] Field of Search ................... 437/31, 32, 33, 41, 437/51, 52; 357/33, 34, 41, 42, 43; 148/DIG. 9, DIG. 11

[56] References Cited

U.S. PATENT DOCUMENTS

| | | | |
|---|---|---|---|
| 4,319,932 | 3/1982 | Jambotkar | 437/31 |
| 4,453,306 | 6/1984 | Lynch et al. | 437/41 |
| 4,531,282 | 7/1985 | Sakai et al. | 437/31 |
| 4,546,536 | 10/1985 | Anantha et al. | 437/31 |
| 4,693,782 | 9/1987 | Kikuchi et al. | 437/31 |
| 4,722,908 | 2/1988 | Burton | 437/31 |
| 4,824,796 | 4/1989 | Chiu et al. | 437/32 |

FOREIGN PATENT DOCUMENTS

| | | | |
|---|---|---|---|
| 0154966 | 12/1979 | Japan | 437/31 |
| 0105363 | 6/1984 | Japan | 437/31 |
| 0171270 | 7/1989 | Japan | 437/31 |

OTHER PUBLICATIONS

Chiu, T., Nonoverlapping Super Self-Aligned Device Structure for High-Performance VLSI, IEEE Electron Device Letters, vol. 11, No. 2, Feb. 1990, pp. 85-88.

Li, G., An advanced High-Performance Trench-Isolated Self-Aligned Bipolar Technology, IEEE Trans. on Electron Devices, vol. ED-34, No. 11, Nov. 1987, pp. 2246-2253.

Chai, S., A New Self-Aligned Bipolar Transistor Using Vertical Nitride Mask, IEDM Tech. Digest., pp. 26-29, 1985.

(List continued on next page.)

Primary Examiner—Olik Chaudhuri
Assistant Examiner—B. Everhart
Attorney, Agent, or Firm—Samuel H. Dworetsky

[57] ABSTRACT

A novel fabrication method is disclosed for fabricating a bipolar transistor having a digitated emitter electrode and a contiguous polysilicon region acting as a self-aligned base contact. The process substantially reduces the parasitic capacitances as well as eliminates the need for the intrinsic base region to be exposed to multiple etching, which results in the fabrication of small and reproducible base widths.

A first polysilicon layer is deposited over the surface of a semiconductor substrate and, then, implanted with base dopants, which are driven into the surface of the active region by a furnace process for forming an intrinsic base region. Emitter dopants are next implanted into the first polysilicon layer. Subsequently, a nitride layer is deposited and the digitated emitter fingers patterned by selective etching. Link-up regions for connecting the intrinsic base region and the extrinsic base regions to be formed later is formed by implanting portions of the substrate free of the emitter fingers with base dopants. Next, oxide sidewalls are formed on the edges of the emitter fingers by depositing a conformal oxide layer and anisotropically etching the oxide layer, leaving vertical portions thereof on the edges of each emitter finger. Finally, a second polysilicon layer is deposited conformally over the entire structure and anisotropically etched back in order to form a planar, contiguous region between each finger of the digitated electrode. Implanting the entire structure with base dopants forms the extrinsic base regions outside the fingers of the digitated electrode. Heating the substrate to cause base dopants from the first polysilicon layer to diffuse into the substrate creates emitter regions under the fingers of the digitated electrode.

5 Claims, 4 Drawing Sheets

OTHER PUBLICATIONS

Sakai, T., Super Self-Aligned Bipolar Technology, Symposium on VLSI Technology, Tech. Digest, pp. 16-19, 1983.

H. Nakashiba et al., "An Advanced PSA Technology for High-Speed Bipolar LSI", IEEE Transactions On Electron Devices, vol. ED-27, No. 8, Aug. 1980, pp. 1390-1394.

T. Sakai et al., "Super Self-Aligned Bipolar Technology", Symposium on VLSI Technology, Tech. Digest, pp. 16-19, 1983.

T. H. Ning et al., "Self-Aligned Bipolar Transistors for High-Performance and Low-Power-Delay VLSI", IEEE Transactions on Electron Devices, vol. ED-28, No. 9, Sep. 1981, pp. 1010-1013.

A. Cuthbertson et al., "Self-Aligned Transistors with Polysilicon Emitters for Bipolar VLSI", IEEE Transactions on Electron Devices, vol. ED-32, No. 2, Feb. 1985, pp. 242-247.

J. L. de Jong et al., "Electron Recombination at the Silicided Base Contact of an Advanced Self-Aligned Poly-Silicon Emitter", IEEE 1988 Bipolar Circuits & Technology Meeting, 1988, pp. 202-205.

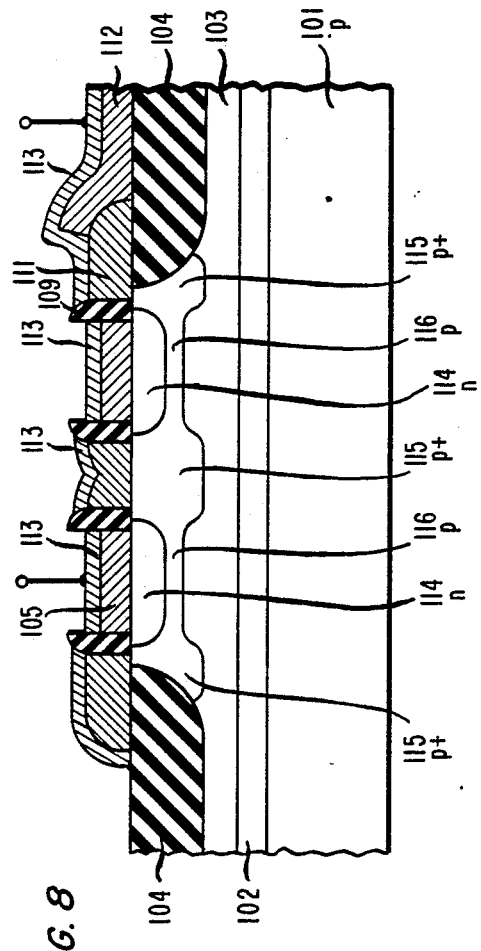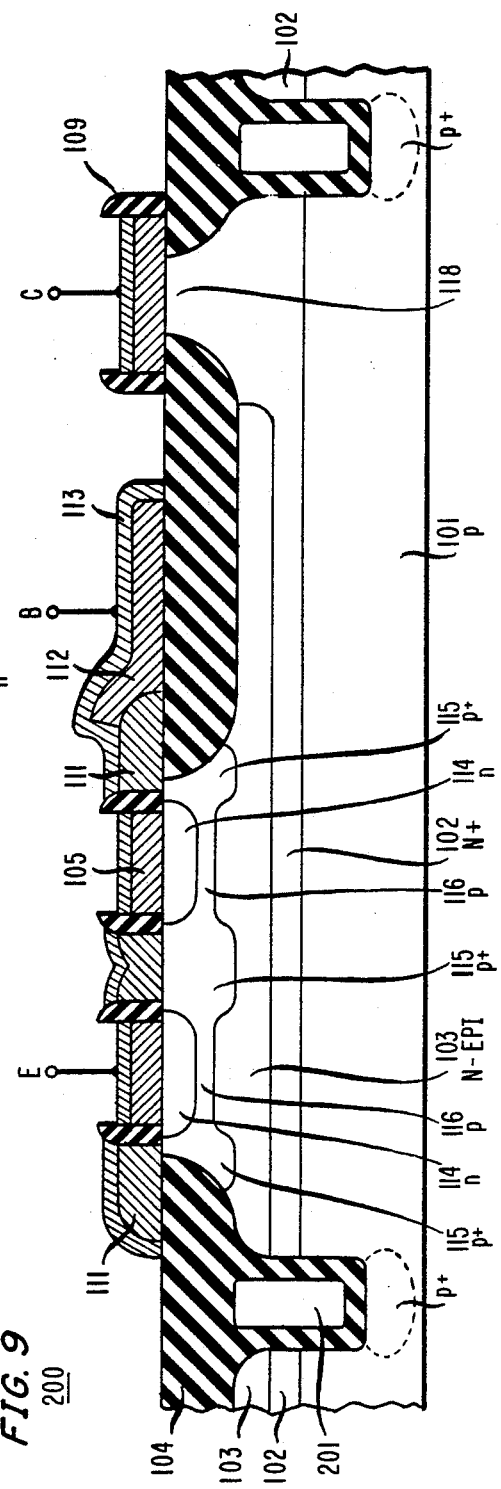
FIG. 8
FIG. 9

PROCESS FOR FABRICATING A BIPOLAR TRANSISTOR WITH A SELF-ALIGNED CONTACT

TECHNICAL FIELD

The present invention relates to bipolar devices and, in particular, to a process for fabricating a bipolar transistor with a self-aligned contact.

CROSS-REFERENCE TO RELATED APPLICATION

This application is related to U.S. application Ser. No. 07/482444, which was filed concurrently herewith.

BACKGROUND OF THE INVENTION

Higher circuit density and lower power-delay product have been the impetus for recent developments in bipolar technology. Exemplary features of today's advanced bipolar structures are self-aligned structure, deep-trench isolation and polysilicon emitter contact. Particularly, self-alignment techniques have significantly improved the performance of high speed bipolar transistors by reducing the extrinsic base-collector junction capacitance and the extrinsic base resistance. The most widely used self-alignment bipolar structure is the super self-aligned technology type (SST). See, for example, H. Nakashiba et al., *IEEE Trans. Electron Devices.*, Vol. ED-27, No. 8, pp. 1390–94 (1980), T. H. Ning et al., *IEEE Trans. Electron Devices.*, Vol. ED 28, No. 9, pp. 1010–13 (1981), and T. Sakai et al., *Electron Letters*, Vol. 19, No. 8, pp. 283–84 (1983).

The SST structure is generally characterized by overlapping double polysilicon layers. Typically, an underlying layer of polysilicon is used as a base electrode and an upper polysilicon layer is used as an emitter electrode. Moreover, with the underlying and upper polysilicon layers defining the extrinsic base and emitter regions, respectively, an oxide spacer or polysilicon spacer is introduced to separate the intrinsic and extrinsic transistor regions. The resulting transistor structure performs acceptably at high speed, but however, requires the intrinsic base region to be exposed to multiple etching after the formation of the base region. Such multiple etching results in an irregularity in the base region that is manifested as a non-uniformity in thickness along the lateral direction. More specifically, the irregular surface topography of the substrate is translated, upon diffusion therein with appropriate dopants, into a surface irregularity in the base region. Subsequent diffusion in forming the base-emitter interface creates a nonuniform dopant interface therebetween. Accordingly, the base region having a nonuniform dopant distribution at the emitter-base interface and an uniform dopant distribution at the base-collector interface produces a nonuniformity in the base width along the lateral direction. Scaling the vertical doping profile and the horizontal dimensions so that all significant delay components are accordingly reduced is severely limited by this irregularity. For example, the nonuniformity in base width makes it prohibitively difficult, if not impossible, to fabricate small and reproducible widths. Additionally, because the two polysilicon layers overlap, the surface topography is inherently non-planar, which could make subsequent fine line lithography steps difficult.

An alternative to the above self-alignment process has been proposed in which a first polysilicon layer is deposited to form the emitter region and a second polysilicon layer is subsequently deposited to form base contacts. More specifically, the first polysilicon layer, which is lightly implanted with emitter dopants, is deposited on a substrate having been previously implanted with base dopants. The second polysilicon layer is then deposited and subsequently heavily implanted with a base type dopant and heat treated for forming the emitter and extrinsic base regions. See, for example, A. Cuthbertson et al., *IEEE Trans. Electron Devices*, Vol., ED 32, No. 2 pp. 242–7 (1985), J. L. de Long et al. and *Proc. of IEEE Bipolar Circuit and Technology Meeting*, pp. 202–5 (1988). Advantageously, in the above process, the intrinsic region can be protected from the polysilicon over-etch process. However, in order to minimize the extrinsic base resistance and reduce the base-collector junction capacitance, several complicated process step are required. See, for example, T. Y. Chiu et al., *IEDM* 1988 *Tech. Digest.*, pp. 752–5.

An important device parameter in high-speed bipolar devices is the base resistance, which consists of two components, the intrinsic base component and extrinsic base component. For all reported self-aligned bipolar structures, including the aforementioned structures above, it may be possible to utilize an digitated emitter geometry for minimizing the intrinsic base component. However, the necessity of contacting portions of the base region located between adjacent emitter fingers limits the spacing therebetween and, hence, the base-collector capacitance.

It is therefore an object of this invention to provide an improved self-aligned transistor having a lower base resistance, both intrinsic and extrinsic, for high speed applications. It is another object of this invention to provide an improved self-aligned transistor having a lower base-collector capacitance, especially for longer length emitter designs. It is still another object of this invention to provide an alternative method of fabricating self-aligned contacts in bipolar transistors without requiring the intrinsic base region to be exposed to multiple etching while minimizing the extrinsic base resistance. It is further an object of this invention to achieve surface planarity by eliminating the need for the emitter and base polysilicon layers to overlap. Finally, it is an object of the invention to reduce the processing complexity while using conventional material.

SUMMARY OF THE INVENTION

These and other objects are achieved in accordance with the invention, which is a novel fabrication method for fabricating a bipolar transistor having a digitated emitter electrode and a contiguous polysilicon region acting as a self-aligned base contact. The process substantially reduces the parasitic capacitances as well as eliminates the need for the intrinsic region to be exposed to multiple etching, which results in the fabrication of small and reproducible base widths.

These features are accomplished by depositing a first polysilicon layer on the surface of a semiconductor substrate having isolated active and collector regions therein. A first polysilicon layer is deposited over the substrate and implanted with base dopants. The base dopants are driven into the surface of the active region by a furnace process for forming an intrinsic base region. Emitter dopants are next implanted into the first polysilicon layer. Subsequently, a nitride layer is deposited and the digitated emitter fingers patterned by selective etching. A link-up region for connecting the extrinsic to be formed later and intrinsic base regions are formed by implanting portions of the substrate free of the emitter fingers with base dopants. Next, oxide sidewalls are formed on the edges of the emitter fingers by depositing a conformal oxide layer and anisotropically etching the oxide layer, leaving vertical portions thereof on the edges of each emitter finger. Ohmic shorting between each emitter finger and the contiguous polysilicon region is achieved by the oxide sidewall interposed therebetween. Finally, a second polysilicon layer is deposited conformally over the entire structure and anisotropically etched back in order to form a planar, contiguous region between each finger of the digitated electrode. Implanting the entire structure with base dopants forms the extrinsic regions outside the fingers of the digitated electrode. Heating the substrate to cause base dopants from the first polysilicon layer to diffuse into the substrate creates emitter regions under the fingers of the digitated electrode. Because the contiguous polysilicon region is etched to substantially the same height as both the oxide sidewalls and emitter electrode, a greater surface planarity is achieved and, thus, the resulting structure more compatible with MOS devices.

Characteristic of the process is that a digitated emitter electrode and contiguous polysilicon region are formed, with polysilicon region acting as a self-aligned base contact. The contiguous polysilicon region is in electrical contact with the extrinsic base region and, moreover, substantially fills the area between each emitter finger. Electrical isolation between each emitter finger in the base contact is achieved by an oxide sidewall interposed therebetween. With the possibility of contacting portions of the extrinsic base region that are located between each emitter finger with a common electrode, the parasitic capacitance as well as the intrinsic base resistance of the bipolar transistor can be substantially reduced. Additionally the emitter spacing can be reduced because no electrode is required to be lithographically defined therebetween. Instead ohmic contact to the base electrode, including the portions between emitter fingers, may be made by a single contact to the polysilicon region outside the emitter finger region where physical dimensions are of no limitations. Moreover, the extrinsic base resistance can be minimized by a complete silicidation of the base electrode and metalization thereof.

BRIEF DESCRIPTION OF THE DRAWING

A more complete understanding of the invention may be obtained by reading the following description in conjunction with the appended drawing in which:

FIGS. 1–8 illustrate various steps in the fabrication of an exemplary bipolar transistor in accordance with one embodiment of the invention;

FIG. 9 illustrates the schematic of a completed bipolar transistor fabricated according to the steps illustrated in FIGS. 1–8.

It will be appreciated that, for purposes of illustration, FIGS. 1–9 are not necessarily drawn to scale.

DETAILED DESCRIPTION

The basic principles of the invention will be described with reference to the sequence of steps as shown in FIGS. 1–8, which illustrate the fabrication of an exemplary vertical n-p-n bipolar transistor. It is to be understood, however, that the following fabrication steps, relating to a particular bipolar structure, are for the purpose of illustration only and not for the purpose of limitation. Other suitable semiconductor devices, whether bipolar or monopolar, could utilize the transistor structure as well as the fabrication method.

Figure 1:
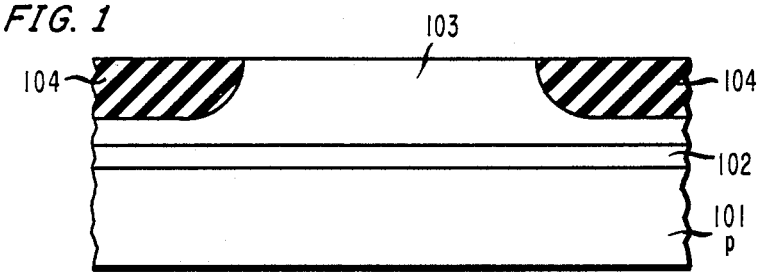

As shown in FIG. 1, the processing begins with silicon substrate 101, which in this example is p-conductivity type, upon which is deposited an arsenic doped, blanket buried n+-layer 102, such as by ion implantation. While substrate 101 is illustrated as comprising a single piece of p-type silicon, it is to be understood that n-type silicon or a composite substrate, such as silicon-on-sapphire, could equally be used therein. Subsequently, 1.0 μm thick n-type epitaxial layer 103 was deposited by means of a chemical vapor deposition technique. N-type epitaxial layer 103 was deposited with a phosphorus concentration of approximately $7 \times 10^{16}$ in order to ensure high current operation without any significant base push-out effect. Base-collector and collector-substrate junctions isolation were achieved by utilizing planar recess local oxidation of silicon (LOCOS) and deep trench processing, respectively. N+-buried layer 102 serves as the collector region for the vertical n-p-n transistor, while the active area between field oxides 104 will ultimately comprise the emitter region as well as both extrinsic and intrinsic base regions.

Figure 2:
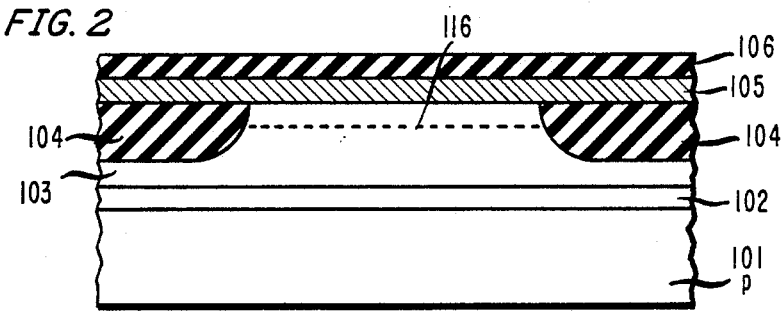

As illustrated in FIG. 2, emitter polysilicon layer 105 having a thickness of 2500 Å was then deposited over the semiconductor area. Double diffusion from polysilicon layer 105 will ultimately be used to form the emitter and intrinsic base junction and, thus, base and emitter dopants must be implanted into polysilicon layer 105. Accordingly, base and emitter dopants were introduced by a $B_{11}$ 25 KeV ($4 \times 10^{14} cm^{-2}$) implant and an arsenic 30 keV ($6 \times 10^{15} cm^{-2}$) implant, respectively. The base implant is followed by a furnace process in order to form intrinsic base region 116. A typical furnace process would be a temperature of 950° C. for approximately 30 minutes in nitrogen.

Figure 3:
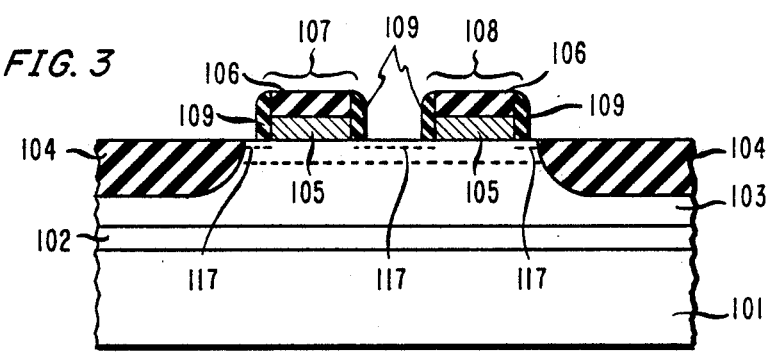

After 3000 Å thick nitride layer 106 was deposited on polysilicon layer 105, emitter stripes 107 and 108 were patterned by selective etching. As illustrated in FIG. 3, emitter stripes 107 and 108, at this point in processing, comprise polysilicon layer 105 and nitride layer 106. Moreover, the emitter stripes utilize a multiple-finger design which minimizes the intrinsic base resistance and, hence, allows the emitter stripes to be closely spaced to the extrinsic base region so as to reduce the total collector area. It will be appreciated that emitter stripes 107 and 108 mask the intrinsic base region from subsequent over-etch processing. In this example, the selective etch consisted of anisotropic nitride etch, which had a polysilicon etch stop, and an anisotropic silicon etch. Next, link-up regions 117 between the intrinsic base region and extrinsic base regions (to be formed later) were formed by an implantation of a low dose of boron. It is important to observe that the link-up implant was introduced to be an independent variable in order to accurately tailor the horizontal doping profile in the base region while maintaining a shallow extrinsic base junction depth. The link-up implant enables the device to achieve a narrow base width and a low base-emitter leakage without suffering premature emitter-collector punch-through. After the link-up implant, oxide sidewalls 109 are formed on the edges of emitter stripes 107 and 108 to electrically isolate the base and emitter contacts to be formed later. Several methods are available for forming these oxide sidewalls. In this example, a tetraethylorthosilicate (TEOS) oxide was deposited conformally over the entire structure to a thickness of approximately 2000 Å and was then etched anisotropically as by oxide etching. Etching was continued until field oxides 104 were exposed and also the portions of buried layer 103 not masked by emitter stripes 107 and 108 were revealed. Oxide sidewalls 109 are the vertical portions of TEOS oxide not removed due to the anisotropy of the etch.

Figure 4:
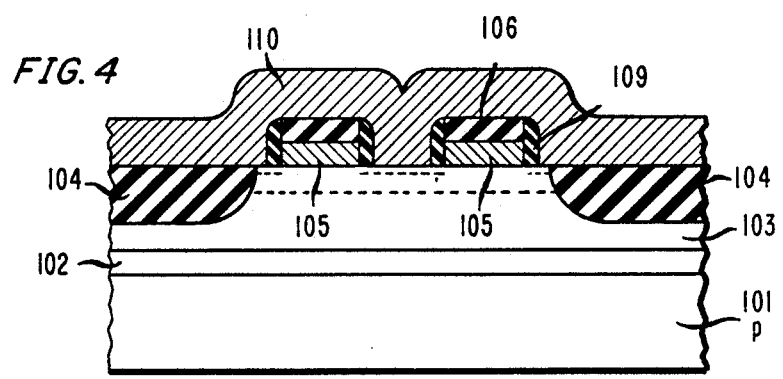
Figure 5:
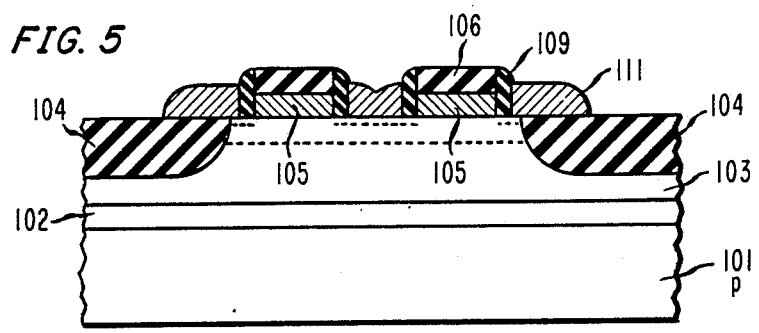
Figure 6:
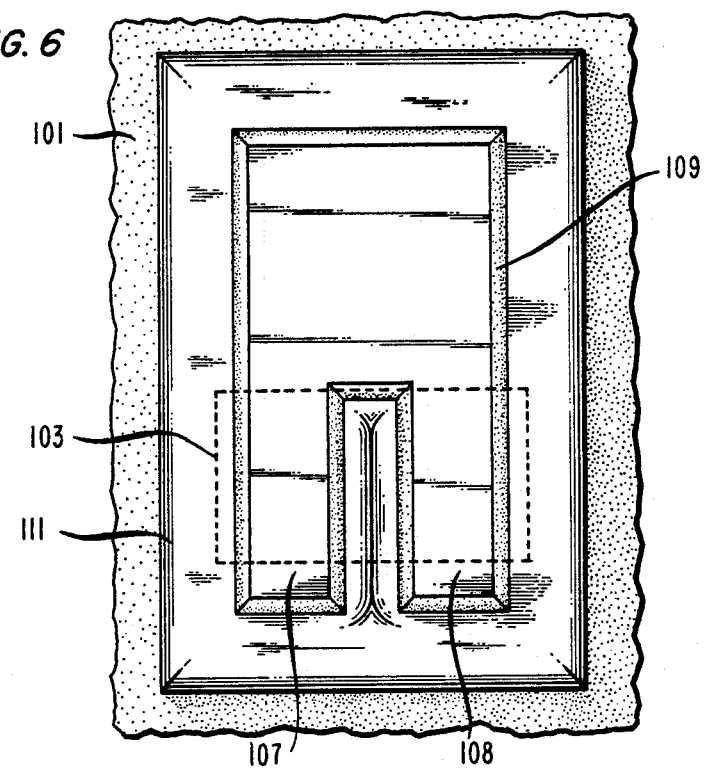

Next, referring to FIG. 4, polysilicon layer 110 was deposited conformally followed by a blanket anisotropic silicon etch, which resulted in the formation of polysilicon region 111, as shown in FIG. 5, similar to the formation of oxide sidewalls 109. Typically, polysilicon layer 110 has a thickness of approximately 0.8–1.0 $\mu$m. Polysilicon layer 110 may, alternatively, comprise an amorphous layer of silicon. In either case, however, it is contemplated that polysilicon region 111, which covers the active area between the emitter edge and the field oxide edge, acts as the base electrode. It should be noted that with a polysilicon layer thickness of 1.0 $\mu$m, a polysilicon region width of approximately 0.7 $\mu$m can be obtained. Importantly, due to the fill-up effect, the active area between emitter stripes 107 and 108 is covered by polysilicon region 111 and, thus, can provide a contiguous base contact around and inbetween the emitter stripes. It is anticipated that because of the fill-up effect, a polysilicon base contact can be deposited between emitter stripes having a lateral spacing as small as a tenth of a micron. Shown in FIG. 6, is a greatly enlarged partial plan view of FIG. 5. It is clearly shown therein that polysilicon region 111 provides a contiguous base contact around emitter stripes 107 and 108, with electrical isolation between emitter stripes 107 and 108 and polysilicon region 111 (base electrode) afforded by oxide sidewalls 109.

Figure 7:
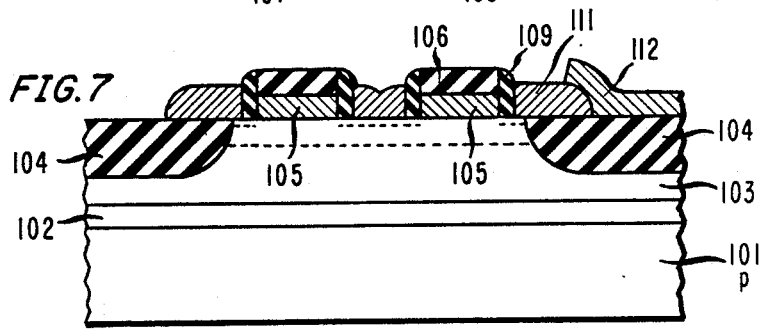

Subsequently, as shown in FIG. 7, local interconnect layer 112 was fabricated to extend polysilicon region 111 to field oxides 104 for facilitating the metalization thereof. While interconnect layer 112 facilitates the metalization of and contact to polysilicon region 111, it is contemplated that with enhanced photolithography, metalization may be made directly to silicon space 111 without interconnect 112. Because the width of polysilicon region 111 is substantially longer than the emitter to field oxide distance, the extrinsic base region can be made small, such as not to be affected by alignment tolerances. It is expected that the alignment tolerance for interconnect layer 112 will be approximately 0.9 $\mu$m, that is, the total width of the oxide sidewall and the polysilicon region.

In the final sequence of steps, as shown in FIG. 8 a blanket extrinsic base implant was performed for defining extrinsic base regions 115, followed by a single junction drive-in for forming emitter regions 114. After selectively removing the prior deposited nitride, such as by hot phosphoric acid, self-aligned titanium silicide 113, was formed on both the emitter base electrode (polysilicon layer 105) and the base electrode (silicon spacer 111 and interconnection layer 112). as shown in FIG. 8. It will be appreciated that the use of titanium silicide 113 will lower the series resistance between ohmic contacts to the base, emitter and collector (not shown). In addition, other useful silicide forming metals, other than titanium, include nickel, palladium and tantalum. Unlike prior art self-aligned transistors wherein fabrication techniques limited the resistance of the polysilicon layer that were used as base and collector electrodes, in the present method, further metalization may be performed without any difficulties since polysilicon layer 105 (emitter electrode) and polysilicon region 111 (base electrode) form a non-overlapping structure. For example, metalization may be afforded by depositing an insulating layer (not shown) over the structure of FIG. 8 and, then, forming openings therein to expose respective portions of 113 covering the base and emitter electrodes. This may be followed by depositing metal layers over the insulator including the openings in order to provide ohmic contacts to portions of the emitter and base electrodes.

Figure 10:
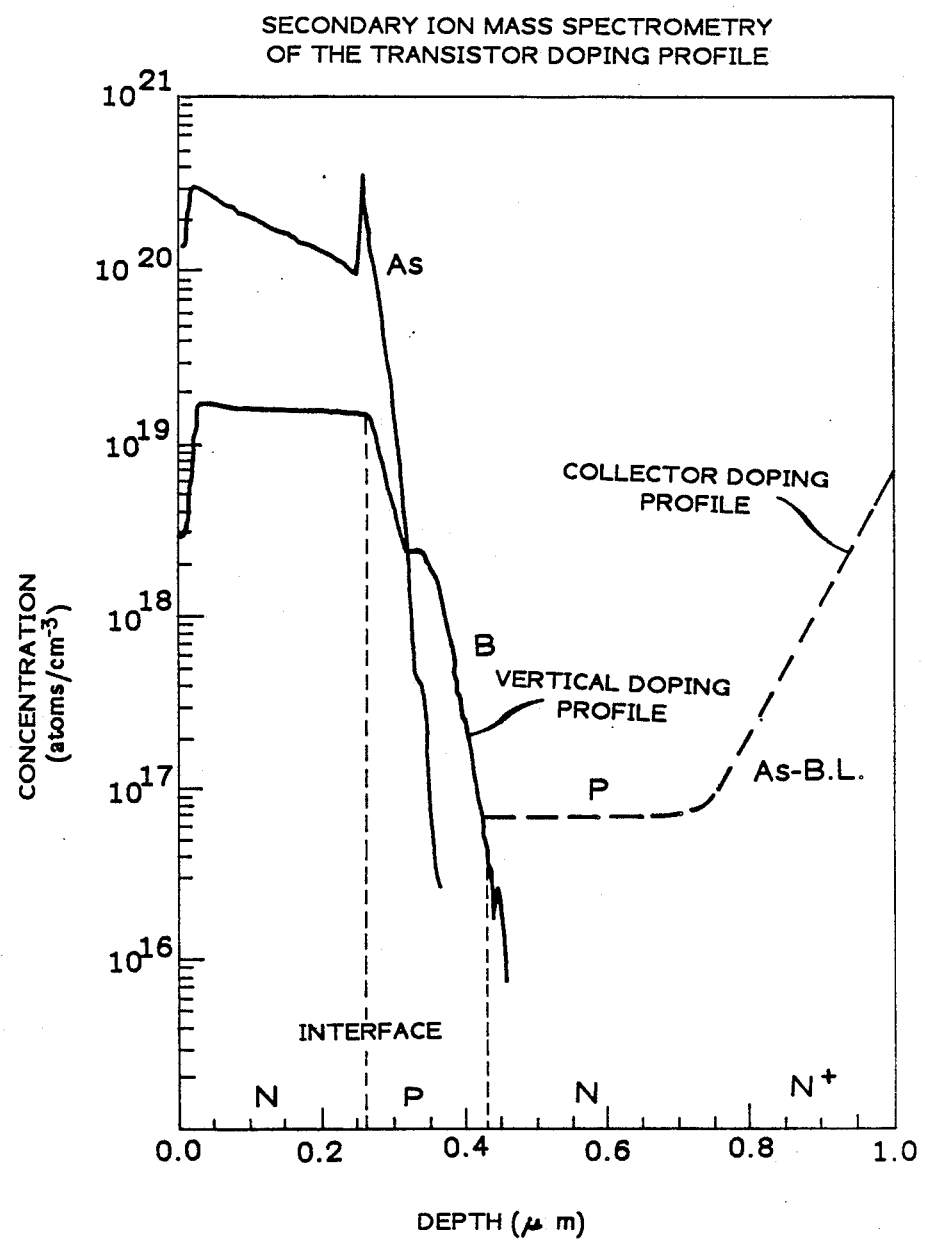
FIG. 10 illustrates the doping profiles of the transistor depicted in FIG. 9.

Illustrated in FIG. 9 is the schematic of completed n-p-n transistor 200 which was fabricated according to the above inventive fabrication method. Like designation of FIGS. 1-8 corresponds to like elements in FIG. 9. The vertical doping profile, as shown in FIG. 10, was measured by Secondary Ion Mass Spectrometry. Additionally, superimposed on the profile is the collector doping profile obtained from the SUPREM III ® process simulation program. As noted from FIG. 10, the doping concentration in collector region 118 is higher than most conventional bipolar transistors so as to delay the onset of the base push-out effect. A Gummel plot of transistor 200, which measures 0.75 $\mu$m $\times$ 9 $\mu$m, indicates a peak current gain of 85. While the current gain is somewhat low, it is believed that optimizing the silicidation process will substantially improve the current drive thereof.

It should be recalled that the emitter region utilized a multi-finger design in order to space the emitter stripe regions closely to the extrinsic base region, among other things, for reducing the total collector area. In particular, transistor 200 had 10 $\mu$m length emitter fingers with a width and spacing of 0.75 $\mu$m. Split base transistor resistance measurements indicated an extracted base resistance of less than 120 $\Omega$ and a calculated extrinsic base resistance of less than 30 $\Omega$, including the series resistance of the link-up region, the extrinsic diffusion region, the silicide electrode and the metal contact (not shown).

Referring to FIGS. 7 and 9, the emitter-base junction was isolated by field oxides 104 on two sides and on the other sides by sidewall oxides 111. I-V measurements of the emitter-base junction and base-collector junction indicate each has a slope of about 64 mV/decade, which approximates the characteristics of an ideal diode. Further, trench sidewalls 201 provide excellent isolation as evident by the low leakage current measured under reversed biased condition.

One of the primary advantages of the present fabrication method and the structures thereof, is the effective reduction of parasitic capacitance therein. The parasitic capacitance for three different size transistors, with a collector concentration of $7 \times 10^{16}$cm$^{-3}$, were measured. The base-emitter capacitance was found to be substantially lower than those of self-aligned transistors utilizing double polysilicon layers because of the non-overlapping structure. Usually, the ECL gate delay in today's high speed silicon bipolar devices is primarily controlled by the collector-base capacitance. Because the emitter stripes are spaced closely and share the same polysilicon base electrode, the base-collector capacitance can be substantially minimized, especially for long length emitter designs. For example, a 0.75 $\mu$m$\times$9 $\mu$m device has less than twice the base-collector capacitance as a 0.75 μm×3 μm device.

Results from experimental practice indicate that for a 0.75 μm×27 μm size transistor, the peak cut-off frequency $f_t$ is approximately 14.5 GHz at a collector current density of 35 kA/cm$^2$. This is with a doping concentration in the collector region of ~4×10$^{16}$cm$^{-3}$, which is a typical value for a range of power-delay trade-off designs. Furthermore, results from computer simulation, such as from the ADVICE ® program simulation, indicate that a stage delay of ~20 to 30 ps with a voltage swing of 400 mW is achievable.

In order to better understand the advantages of the present inventive method, it is interesting to compare some processing and structural characteristics thereof to the prior art. Typically, self-aligned transistors utilizing prior art fabrication techniques require that the intrinsic base region be subjected to over-etching, which resulted in a nonuniform thickness, i.e. base width, along the lateral direction. In contradistinction, the surface of the intrinsic area of fabricated transistors are not exposed to etching. Etching only occurs outside the intrinsic area where effects dependent on nonuniform thickness are minimal. Additionally, as noted aboveherein, the juxtaposition of emitter stripes was limited by the resistive requirement of the underlying polysilicon layer used to contact the base region. In the prior art, the metalization of the underlying polysilicon layer was prohibitively complex due to the restrictions associated with the subsequent deposition of the upper polysilicon layer use to contact the emitter region. In present method, the conductive regions, namely, polysilicon region 111 and interconnect layer 112, can be metalized to advantageously lower their resistivity and, thus, increase the speed of the device because of the reduced series base resistance. Furthermore, this metalization may be effected with low temperature silicide since no high temperature processing is involved therein and, moreover, may also be performed in a single step.

Apposite to the speed of the devices fabricated with the present method is the fact that the structure thereof permits the division of emitter stripes into multiple, closely spaced emitter regions having a shared interposed common base electrode, i.e. polysilicon region 111. As a result, the higher packing density not only affords a lower base resistance, but, also a lower collector-substrate capacitance that results in higher speeds. It is anticipated that the close emitter stripe spacing will permit the fastest speed available for digital applications, excluding the use of GaAs bipolar devices.

An additional advantage to the present process involves the ability to engineer the lateral p-doping in the base region. While the fabricated device above was a vertical n-p-n transistor, the p region extends laterally on either side thereof. It is this lateral extension which can be more effectively engineered because, unlike prior fabrication techniques which utilized a two p-doping step, the present method involves three p-doping steps: intrinsic base region, link-up region and extrinsic base region. Those skilled in the art will observe that the additional doping step allows the link-up region to be more effectively engineered. In particular, by optimizing the horizontal doping profile in the link-up region, the device reliability associated with electron trapping may be improved by orders of magnitude. Additionally, the horizontal doping can be sufficiently large enough to prevent emitter to collector punch through and low enough to prevent emitter to base tunneling.

It is anticipated that bipolar transistors fabricated according the teachings of this invention will have numerous applications. For example, they may be used in high speed optical repeaters where they will be able to operate at data rates in excess of ten giga-bits per second. Furthermore, such device structure will be more compatible with MOS devices because of their surface planarity.

It should be understood that the present fabrication method and device structure may be applicable to other semiconductor devices, such as monopolar devices. In fabricating monopolar devices, however, it is anticipated that no prior diffusion step is required to form a single conductivity region under the polysilicon region and oxide sidewalls. Various modifications may also be made by those skilled in the art which embody the teachings of the invention and fall within the spirit and scope thereof.

We claim:

1. A process for fabricating a bipolar transistor on a silicon substrate where field oxide regions have been created to delineate active region of said bipolar transistor and isolate base-collector and collector-substrate junctions, said process comprising:

depositing a first polysilicon layer over the entire structure;

implanting said first polysilicon layer with base dopants;

heating the substrate to cause said base dopants from the first polysilicon layer to diffuse into the substrate thereby creating an intrinsic base region;

implanting said first polysilicon layer with emitter dopants;

depositing a nitride layer over said first polysilicon layer;

selectively etching said first polysilicon layer and said nitride layer to create a digitated electrode of polysilicon and nitride;

implanting portions of said first polysilicon layer free of said nitride layer with base dopants to provide a link-up region between said intrinsic base region and extrinsic base regions, said extrinsic base regions latter to be formed between the fingers of said digitated electrode;

depositing a conformal oxide layer over the entire structure;

anisotropically etching said conformal oxide layer to create oxide sidewalls on the edges of said digitated electrode, said oxide sidewalls etched so as to be substantially planar with said digitated electrode;

conformally depositing a thick, second polysilicon layer over the entire structure;

anisotropically etching said second polysilicon layer to create a contiguous polysilicon region between the fingers of said digitated electrode for contacting the extrinsic base regions, said contiguous polysilicon region etched so as to be substantially planar with said oxide sidewalls;

implanting the entire structure with base dopants for forming extrinsic base regions outside the fingers of said digitated electrode;

heating the substrate to cause emitter dopants from the first polysilicon layer to diffuse into the substrate thereby creating the emitter regions under the fingers of said digitated electrode; and removing said nitride layer from the first polysilicon layer.

2. In the process as defined in claim 1 wherein said emitter dopants have a N type conductivity and said base dopants have a P type conductivity.

3. In the process as defined in claim 1 wherein said emitter dopants have a P type conductivity and said base dopants have a N type conductivity.

4. In the process as defined in claim 2 or 3 further comprising the step of:
    forming first and second silicide layers over said digitated electrode and said contiguous polysilicon region, respectively.

5. In the process as defined in claim 4 further comprising the step of:
    forming first and second metalization layers over said first and second silicide layers, respectively.

* * * * *